United States Patent
Mita et al.

(10) Patent No.: US 7,484,556 B2
(45) Date of Patent: Feb. 3, 2009

(54) HEAT DISSIPATING MEMBER

(75) Inventors: Kunihiko Mita, Gunma-ken (JP);
Kazuhiko Tomaru, Gunma-ken (JP);
Yoshitaka Aoki, Gunma-ken (JP);
Hironao Fujiki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/527,641

(22) Filed: Sep. 27, 2006

(65) Prior Publication Data
US 2007/0023179 A1 Feb. 1, 2007

Related U.S. Application Data

(63) Continuation of application No. 10/250,683, filed as application No. PCT/JP02/02669 on Mar. 20, 2002, now abandoned.

(30) Foreign Application Priority Data
Apr. 23, 2001 (JP) ............................. 2001-124116

(51) Int. Cl.
*F28F 7/00* (2006.01)
*F28F 13/00* (2006.01)
*H05K 7/20* (2006.01)

(52) U.S. Cl. .................. 165/185; 185/135; 185/905

(58) Field of Classification Search ............... 165/185, 165/80.3, 135, 905; 257/706, 720, 726; 428/446, 428/389, 539.5, 408, 209, 402–403, 407, 428/447; 361/704, 697, 709; 524/860, 863
See application file for complete search history.

(56) References Cited

U.S. PATENT DOCUMENTS

| | | | |
|---|---|---|---|
| 3,974,122 A | 8/1976 | Sato et al. | |
| 5,569,684 A | 10/1996 | Okami et al. | |
| 5,783,862 A | 7/1998 | Deeney | |

(Continued)

FOREIGN PATENT DOCUMENTS

DE 19932953 1/2000

(Continued)

OTHER PUBLICATIONS

"Perforated Polydimethylsiloxane Rubber as Thermal Paste Retainer", IBM Technical Disclosure Bulletin, XP000475662, vol. 37, No. 10, Oct. 1994, p. 273.

(Continued)

*Primary Examiner*—Tho V Duong
(74) *Attorney, Agent, or Firm*—Oblon, Spivak, McClelland, Maier & Neustadt, P.C.

(57) ABSTRACT

A heat dissipating member which is disposed between a heat generating electronic component which when operated generates heat and reaches a temperature higher than room temperature and a heat dissipating component is characterized in that the heat dissipating member is non-fluid in a room temperature state prior to operation of the electronic component and acquires a low viscosity, softens or melts under heat generation during operation of the electronic component to fluidize at least a surface thereof so as to fill between the electronic component and the heat dissipating component without leaving any substantial voids, and the heat dissipating member is formed of a composition comprising a silicone resin and a heat conductive filler.

18 Claims, 1 Drawing Sheet

U.S. PATENT DOCUMENTS

| | | | |
|---|---|---|---|
| 5,847,034 A | 12/1998 | Achenbach et al. | |
| 5,930,893 A | 8/1999 | Eaton | |
| 5,931,222 A | 8/1999 | Toy et al. | |
| 5,945,217 A | 8/1999 | Hanrahan | |
| 5,969,035 A | 10/1999 | Meinhardt et al. | |
| 5,998,509 A | 12/1999 | Hayase et al. | |
| 6,040,362 A | 3/2000 | Mine et al. | |
| 6,054,198 A | 4/2000 | Bunyan et al. | |
| 6,124,372 A | 9/2000 | Smith et al. | |
| 6,139,920 A | 10/2000 | Smith et al. | |
| 6,162,663 A | 12/2000 | Schoenstein et al. | |
| 6,165,612 A * | 12/2000 | Misra | 428/344 |
| 6,169,142 B1 | 1/2001 | Nakano et al. | |
| 6,174,841 B1 | 1/2001 | Yamada et al. | |
| 6,265,784 B1 * | 7/2001 | Kawano et al. | 257/788 |
| 6,448,329 B1 * | 9/2002 | Hirschi et al. | 524/588 |
| 6,783,692 B2 | 8/2004 | Bhagwagar | |
| 6,794,030 B1 * | 9/2004 | Okada et al. | 428/343 |
| 2004/0043229 A1 | 3/2004 | Aoki et al. | |
| 2004/0054029 A1 | 3/2004 | Fujiki et al. | |

FOREIGN PATENT DOCUMENTS

| | | |
|---|---|---|
| JP | 2-166753 | 6/1990 |
| JP | 2000-327917 | 11/2000 |
| JP | 2001-89756 | 4/2001 |

OTHER PUBLICATIONS

U.S. Appl. No. 11/527,641, filed Sep. 27, 2006, Mita, et al.
U.S. Appl. No. 10/643,978, filed Aug. 20, 2003, Aoki, et al.
U.S. Appl. No. 10/250,685, filed Jul. 17, 2003, Fujiki, et al.

* cited by examiner

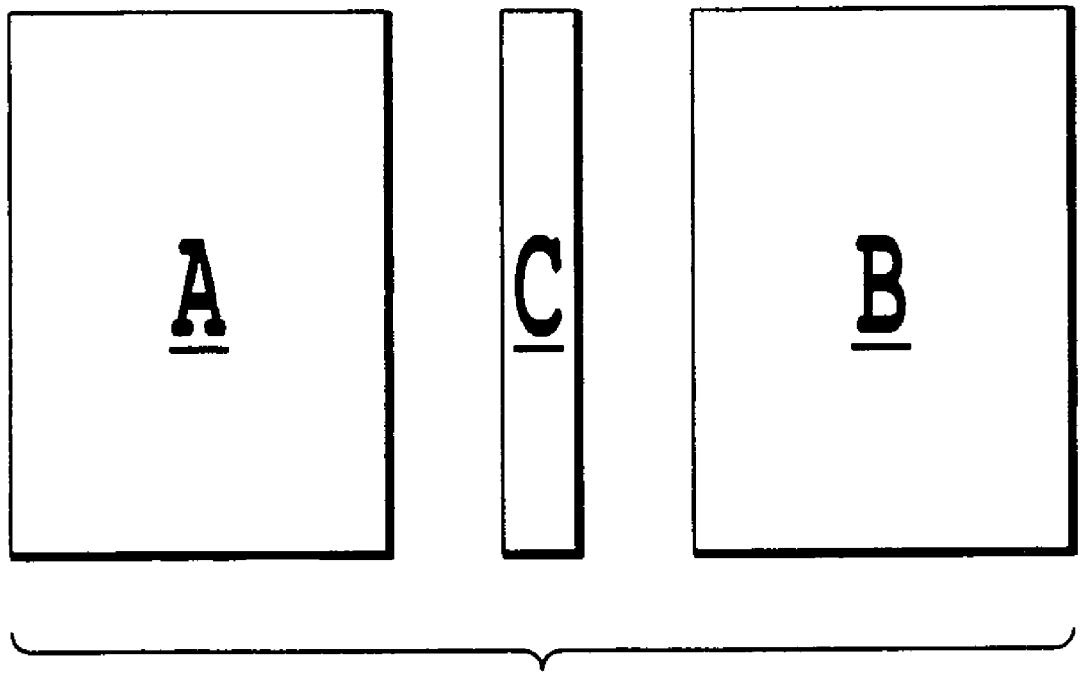

HEAT DISSIPATING MEMBER

CROSS-REFERENCE TO RELATED APPLICATIONS

The present application is a continuation of U.S. Ser. No. 10/250,683, filed on Jul. 17, 2003, which is a National Stage (371) of PCT/JP02/02669, filed on Mar. 20, 2002, which claims priority to JP 2001-124116, filed on Apr. 23, 2001.

TECHNICAL FIELD

This invention relates to a heat dissipating member which is disposed between a thermal interface of a heat generating electronic component which when operated generates heat and reaches a temperature higher than room temperature and a heat dissipating component such as a heat sink or circuit board, for cooling the electronic component by heat transfer. More particularly, the invention relates to a heat dissipating member which lowers its viscosity, melts or softens at a temperature within the operating temperature range of an electronic component to become more conformal to the thermal interface in order to improve the heat transfer from the electronic component to a heat dissipating component, and has improved flame retardance and heat resistance.

BACKGROUND ART

Circuit design for the latest electronic equipment, including TVs, radios, computers, medical devices, office equipment and communications devices, has become increasingly complex. For example, integrated circuits which contain the equivalent of several hundreds of thousands of transistors are now manufactured for these and other kinds of equipment. This rise in design complexity has been accompanied by a parallel trend toward the fabrication of ever smaller electronic components. That is, manufacturers are finding ways to fit larger numbers of such components on steadily shrinking device footprints while at the same time continuing to reduce the dimensions of the device.

These electronic components—particularly central processing units (CPUs), drivers, integrated circuits (ICs), memories and other large-scale integration (LSI) devices—which are used in electronic equipment such as personal computers, digital video disks and cell phones generate more heat as a result of the increasing level of integration. Such heat generation raises problems of failure or inoperability. It is thus needed to effectively dissipate the heat generated by electronic components.

Many heat dissipating methods, as well as heat dissipating articles and compositions used in such methods, have already been devised to reduce the heat generated by electronic components. Heat sinks in the form of plates made of brass and other high thermal conductivity metals are used in electronic equipment to hold down the rise in temperature of electronic components therein during use. These heat sinks carry away heat generated by the electronic components and release that heat from surfaces by means of a temperature difference with outside air.

For heat generated by an electronic component to be efficiently transferred to a heat sink, it is necessary that the heat sink be placed in close contact with the electronic component. Because of height differences among various electronic components and component tolerances in the assembly process, a flexible heat conductive sheet or a heat conductive grease is often placed between the electronic components and the heat sink so that heat transfer from the electronic components to the heat sink takes place through the heat conductive sheet or grease. Heat conductive sheets made of heat conductive silicone rubber or the like (heat conductive silicone rubber sheets) are used as the heat conductive sheet.

However, the heat conductive grease is awkward to handle (or to process), and problems with the heat conductive sheets are their interfacial thermal resistance and insufficient actual heat dissipation.

Then JP-A 2000-509209 proposes a phase transition heat dissipating sheet, which is poor in flame retardance, heat resistance and weather resistance. JP-A 2000-327917 proposes a silicone base thermosoftening composition, which has poor flame retardance and heat resistance due to the special silicone base wax used, and lacks flexibility when formed into a sheet.

DISCLOSURE OF THE INVENTION

The present invention has been made to overcome the above-discussed problems, and its object is to provide a heat dissipating member which has an enhanced heat dissipation ability, is easily attached to and detached from electronic components and heat sinks, and has improved flame retardance, heat resistance and weather resistance.

Making extensive investigations to attain the above object, we have discovered that when an uncured composition comprising a silicone resin and a heat conductive filler which composition is solid at normal temperature and thermally softens, lowers its viscosity or melts in a certain temperature range so that it can be readily formed into a sheet or other necessary shape is used at the interface between a heat generating electronic component and a heat dissipating component, the resulting heat dissipating member has an enhanced heat dissipation ability because of the reduced interfacial contact thermal resistance due to softening by the heat generated by the electronic component during operation, is easily attached to and detached from the electronic component and heat sink, and has improved flame retardance, heat resistance and weather resistance.

More specifically, it has been found that when a composition formulated by selecting from silicone resins a component which is solid at normal temperature and thermally softens, lowers its viscosity or melts in a certain temperature range, and filling the component with a heat conductive filler is disposed at the interface between a heat generating electronic component and a heat dissipating component, the desired heat dissipation is accomplished, and the resulting heat dissipating member has an enhanced heat dissipation ability over prior art thermosoftening heat dissipating members. The present invention is predicated on this finding.

Accordingly, the present invention provides a heat dissipating member which is disposed between a heat generating electronic component which when operated generates heat and reaches a temperature higher than room temperature and a heat dissipating component, characterized in that the heat dissipating member is non-fluid in a room temperature state prior to operation of the electronic component and acquires a low viscosity, softens or melts under heat generation during operation of the electronic component to fluidize at least a surface thereof so as to fill between the electronic component and the heat dissipating component without leaving any substantial voids, and the heat dissipating member is formed of a composition comprising a silicone resin and a heat conductive filler.

BRIEF DESCRIPTION OF THE DRAWINGS

The drawing of the present application illustrates a heat dissipating member (identified as "C") which is disposed between a heat generating electronic component (identified as "A") which when operated generates heat and reaches a temperature higher than room temperature and a heat dissipating component (identified as "B").

BEST MODE FOR CARRYING OUT THE INVENTION

The invention is described more fully below.

The heat dissipating member of the invention, which is disposed between a heat generating electronic component which when operated generates heat and reaches a temperature higher than room temperature and a heat dissipating component, is non-fluid in a room temperature state prior to operation of the electronic component and acquires a low viscosity, softens or melts under heat generation during operation of the electronic component to fluidize at least a surface thereof so as to fill between the electronic component and the heat dissipating component without leaving any substantial voids.

The heat dissipating member is formed of a composition comprising a silicone resin and a heat conductive filler. Now these components and the method of preparing the heat dissipating member are described in detail.

Silicone Resin

Any silicone resin may be used as the matrix of the heat dissipating member of the invention so long as the heat dissipating member is substantially solid (non-fluid) at normal temperature and softens, acquires a low viscosity or melts in a temperature range from a certain temperature, preferably 40° C. to the maximum temperature reached as a result of heat generation by the heat generating electronic component, more preferably about 40 to 100° C., and most preferably about 40 to 90° C., so that at least the surface fluidizes. The matrix basically becomes an important factor that undergoes thermal softening.

Since the temperature at which thermal softening, viscosity lowering or melting occurs refers to that of the heat dissipating member, the silicone resin itself may have a melting point below 40° C. (or the silicone resin itself may be fluid at normal temperature).

The matrix that undergoes thermal softening may be any one selected from silicone resins as mentioned above. To maintain a non-fluid state at normal temperature, the silicone resin is selected from polymers comprising $RSiO_{3/2}$ units (referred to as T units, hereinafter) and/or $SiO_2$ units (referred to as Q units, hereinafter) and copolymers comprising these units and $R_2SiO$ units (referred to as D units, hereinafter) while a silicone oil or silicone gum consisting of D units may be added thereto. Preferred of these are silicone resins comprising T and D units, and combinations of a silicone resin comprising T units with a silicone oil or silicone gum having a viscosity of at least 100 Pa·s at 25° C. The silicone resin may be end-capped with $R^3SiO_{1/2}$ units (M units).

Herein R is a substituted or unsubstituted monovalent hydrocarbon radical having 1 to 10 carbon atoms, preferably 1 to 6 carbon atoms. Examples include alkyl radicals such as methyl, ethyl, propyl, isopropyl, butyl, isobutyl, tert-butyl, pentyl, neopentyl, hexyl, cyclohexyl, octyl, nonyl and decyl; aryl radicals such as phenyl, tolyl, xylyl and naphthyl; aralkyl radicals such as benzyl, phenylethyl and phenylpropyl; alkenyl radicals such as vinyl, allyl, propenyl, isopropenyl, butenyl, hexenyl, cyclohexenyl and octenyl; and substituted ones of the foregoing in which some or all of the hydrogen atoms are substituted with halogen atoms such as fluorine, bromine and chlorine, cyano radicals or the like, such as chloromethyl, chloropropyl, bromoethyl, trifluoropropyl, and cyanoethyl. Of these, methyl, phenyl and vinyl radicals are especially preferred.

The silicone resins are described in more detail. The silicone resins contain T units and/or Q units, and are generally designed as comprising M units and T units, or M units and Q units. However, the introduction of T units optionally in combination with D units is effective in order that the silicone resin have improved toughness in the solid state (to ameliorate brittleness for preventing fracture during handling). The substituent groups R on the T units are desirably methyl and phenyl groups whereas the substituent groups R on the D units are desirably methyl, phenyl and vinyl groups. The ratio of T units to D units is preferably from 10:90 to 90:10, especially from 20:80 to 80:20.

It is noted that in the case of a commonly used resin synthesized from M units and T units or even a resin synthesized from M units and Q units and containing T units, mixing a high viscosity (at least 100 Pa·s) oil or gum-like compound composed mainly of D units and terminated with M units can improve brittleness and prevent pumping-out (formation of bubbles due to separation of filler from base siloxane, or outflow of base siloxane) upon receipt of heat shocks. Accordingly, when a silicone resin containing T units, but not D units is used, it is preferred to add to this silicone resin a high viscosity oil or gum-like compound composed mainly of D units.

Then, in the event where a silicone resin having a softening point contains T units, but not D units, a material which is easy to handle is obtainable for the above reason by adding a high viscosity oil or gum composed mainly of D units to the silicone resin. The amount of high viscosity oil or gum-like compound composed mainly of D units added is preferably 1 to 100 parts by weight, especially 2 to 10 parts by weight per 100 parts by weight of the silicone resin having a softening or melting point higher than normal temperature. With less than 1 part by weight, there is a possibility for a pump-out phenomenon to occur. More than 100 parts by weight can increase the thermal resistance and reduce the heat dissipation ability.

As mentioned above, a silicone resin having a relatively low molecular weight is desirably used in order to induce a critical lowering of viscosity. The molecular weight of the low-melting silicone resin is preferably 500 to 10,000, especially 1,000 to 6,000.

It is noted that a silicone resin capable of imparting flexibility and tack (required by the need to temporarily attach the heat dissipating sheet to the electronic component or heat sink) to the heat dissipating member of the invention is preferably used herein. As the silicone resin of this type, a polymer having a single viscosity may be used. However, the use of a mixture of two or more polymers having different viscosity is also acceptable because a sheet having a good balance of flexibility and tack is obtained.

It is preferable for the heat dissipating member of the invention to be first thermally softened, viscosity lowered or melted, then crosslinked because this can enhance the reworkability. That is, initial thermal softening of the composition so as to bring it into close contact with the heat generating electronic component and heat dissipating component, followed by crosslinking enable the heat dissipating member to conform to heat-induced expansion and contraction of the components while maintaining a low thermal resistance. Moreover, when reworking is required, the crosslinked state permits the heat dissipating member to be easily stripped from the electronic component and heat dissipating component. The crosslinked state also permits the heat dissipating member to maintain its shape even at a temperature above the softening point and to play its own role at elevated temperatures.

From this point of view, it is desirable for the composition be curable by a crosslinking reaction. To this end, it is preferable for the above-described polymers to have terminal or pendant functional groups for curing reaction. Usually unsaturated aliphatic groups, silanol groups and alkoxysilyl groups may be used as the functional groups for crosslinking.

Heat Conductive Filler

Examples of heat conductive fillers that may be used in the practice of the invention include the following substances commonly employed as heat conductive fillers: metals such as nonmagnetic copper and aluminum; metal oxides such as alumina, silica, magnesia, red iron oxide, beryllia, titania and zirconia; metal nitrides such as aluminum nitride, silicon nitride and boron nitride; artificial diamond and silicon carbide. These heat conductive fillers may be used singly or as combinations of two or more thereof.

These heat conductive fillers preferably have an average particle size of 0.1 to 100 µm, and especially 0.1 to 25 µm. With less than 0.1 µm, the viscosity during mixing and loading step may be high enough to interfere with efficient operation. When a heat conductive member is used in practice, the viscosity during heat compression may be high enough to increase the space between the electronic component and the heat dissipating component, resulting in increased thermal resistance and rendering it difficult to fully exert the heat dissipating ability. In excess of 100 µm, the viscosity during operation becomes lower. However, when a heat dissipating member is used in practice, it may not be compression bonded to the area where the space between the electronic component and the heat dissipating component is less than 100 µm during heat compression, resulting in increased thermal resistance and rendering it difficult to fully exert the heat dissipating ability. Therefore, as mentioned above, the average particle size is preferably in the range of 0.1 to 100 µm, and an average particle size of 0.1 to 25 µm is desirable for acquiring both fluidity and heat conduction.

The particle shape is preferably spherical. Use may be made of heat conductive filler having one particle shape or having a plurality of different particle shapes in admixture. To enhance thermal conductivity, it is recommended that particles of two or more different average particle sizes be blended so as to approach a closest packing arrangement. It is preferred to use a mixture of a filler having an average particle size of 0.1 to 5 µm and a filler having an average particle size of 5 to 25 µm.

The heat conductive filler is included in such amounts that the heat dissipating member may have a thermal conductivity of at least 0.5 W/mK, especially at least 1.0 W/mK, specifically in amounts of 10 to 3,000 parts by weight, and most preferably 100 to 2,500 parts by weight, per 100 parts by weight of the silicone resin. Too little heat conductive filler may fail to provide a sufficient heat conducting ability, whereas too much may detract from the sheet formation and working of the composition.

Preferably, the heat conductive filler has been surface treated with a surface treating agent. Examples of the surface treating agent for the heat conductive filler include organosilicon compounds containing silanol groups and/or hydrolyzable groups and having a low molecular weight, preferably a degree of polymerization of up to 100, specifically alkoxy group-containing diorganopolysiloxanes and alkoxy group-containing silanes. The surface treatment may be done either by previously surface treating the heat conductive filler or by adding the treating agent as a dispersant during the mixing of the silicone resin with the heat conductive filler.

Other Additives

The heat dissipating member of the invention may include also other optional constituents, such as additives and fillers that are commonly used in synthetic rubbers, insofar as this does not compromise the objects of the invention. Specific examples of such additional constituents that may be used include release agents such as silicone oils and fluorine-modified silicone surfactants; colorants such as carbon black, titanium dioxide and red iron oxide; flame retardants such as platinum catalysts, metal oxides like iron oxide, titanium oxide and cerium oxide, and metal hydroxides; and processing aids used when formulating conventional rubbers and plastics, such as process oils, reactive silanes or siloxanes, reactive titanate catalysts and reactive aluminum catalysts.

Also optionally, fine powders such as precipitated or calcined silica and thixotropic agents may be added as the agent for preventing the heat conductive filler from settling at elevated temperatures.

Method of Preparation

The method of preparing the heat dissipating member of the invention is by uniformly mixing the above-described ingredients on a rubber blending apparatus such as a two-roll mill, Banbury mixer, dough mixer (kneader), gate mixer or planetary mixer, while heating if necessary, to form a silicone resin composition.

The heat dissipating member is generally obtained by molding the composition into a sheet or film shape. The method of molding into a sheet or film shape is by extrusion, calendering, rolling or pressing of the kneaded composition, or by dissolving the composition in a solvent followed by coating. It is noted that the thickness of the sheet or film is preferably 0.01 to 2 mm, more preferably 0.05 to 1 mm, especially 0.1 to 0.5 mm, though not critical. It is possible to attach a release sheet or the like to the heat dissipating member prior to use.

It is desirable for the composition and the sheet or film thereof to have a thermal conductivity of at least 0.5 W/mK, more desirably 1 to 20 W/mK. With a thermal conductivity of less than 0.5 W/mK, the thermal conduction between the electronic component and the heat dissipating component such as heat sink may become low, failing to fully exert the heat dissipating ability.

Moreover, it is desirable for the heat dissipating member of the invention from the working standpoint that the composition and the sheet or film thereof have a plasticity at 25° C. (JIS K 6200) in a range of 100 to 700, and preferably 200 to 600. At a plasticity at 25° C. of less than 100, mounting and handling on electronic components may become inefficient. At a plasticity greater than 700, sheet formation and mounting and handling on electronic components may become inefficient.

It is preferable for the heat dissipating member of the invention from the standpoint of efficient fill between an electronic component and a heat dissipating component that the composition and the sheet or film thereof have a viscosity at 80° C. of $1\times10^2$ to $1\times10^5$ Pa·s, and especially $5\times10^2$ to $5\times10^4$ Pa·s. At a viscosity of less than $1\times10^2$ Pa·s, run-off of the composition or sheet from between an electronic component and a heat dissipating component such as a heat sink may occur. At a viscosity of more than $1\times10^5$ Pa·s, the contact thermal resistance may increase, which lowers the heat conduction between an electronic component and a heat dissipating component such as a heat sink, failing to exhibit an adequate heat dissipating ability.

The resulting heat dissipating member can easily be installed on and removed from an electronic component and a heat dissipating component such as heat sink. It lowers its viscosity, softens or melts under the effect of heat generated during operation of the electronic component, thereby reducing interfacial contact thermal resistance between the electronic component and the heat dissipating component. In addition to an enhanced heat dissipating ability, the heat dissipating member has flame retardance, heat resistance, weather resistance or the like as well as ease of handling.

Then the heat dissipating member is placed between a heat generating electronic component which when operated, generates heat and reaches a temperature higher than room temperature, and a heat dissipating component. At the time of installation, the heat dissipating member is not set in entirely close contact with the electronic component, instead, small gaps remain. However, heat generated by operation of the electronic component causes the heat dissipating member to soften, acquire a low viscosity or melt so that at least the surface fluidizes, filling the small gaps therebetween to achieve complete close contact with the electronic component. This has the effect of lowering the interfacial contact thermal resistance as noted above.

Since the heat dissipating member is flame retardant as well, it is self-extinguishing in the event of a fire by any abnormality, preventing the fire from spreading.

EXAMPLE

Examples and comparative examples are given below for illustrating the present invention, but the invention is not limited thereto.

Examples 1-6 and Comparative Examples 1-4

Preparation Procedure and Performance Evaluation of thermosoftening Heat Dissipating Sheet The starting materials of the formulation shown in Table 1 were admitted into a planetary mixer where they were agitated and mixed at 100° C. for 2 hours. Then the mixture was deaerated and mixed on a two-roll mill. The resulting compound was sheeted into a sheet of 0.5 mm thick, i.e., a thermosoftening sheet.

The thermosoftening sheets of Examples 1-6 and Comparative Examples 1-2 were punched into specimens of a predetermined shape, which were measured for specific gravity, thermal conductivity, thermal resistance, viscosity, thermosoftening point, handleability, heat resistance, and the number of cracks after a thermal cycling test, by the evaluation methods described below. The results are shown in Table 1. The thermosoftening sheets of Example 2 and Comparative Example 2 and the thermosoftening sheets of Comparative Examples 3-4 which were obtained by the same procedure as above using the starting materials of the formulation shown in Table 2 were punched into specimens of a predetermined shape, which were determined for flame retardance by the evaluation method described below. The results are shown in Table 2.

Evaluation Methods

1) Specific gravity:
   Measured by the in-water replacement method at 25° C.

2) Thermal conductivity:
   Measured by the laser flash method using Micro Flash by Horometrix Micromet Co.

3) Thermal resistance:
   A sample of 0.5 mm thick punched into a TO-3 transistor shape was interposed between a transistor 2SD923 (trade name, Fuji Electric Co., Ltd.) and a heat sink FBA-150-PS (trade name, OS Co., Ltd.), and a compression load of 50 psi was applied. The heat sink was placed in a thermostat water tank and held at 65° C. Then a power of 10 V and 3 A was fed to the transistor. After 5 minutes, the temperature (T1) of the transistor and the temperature (T2) of the heat sink were measured using thermocouples embedded in the transistor and heat sink. The thermal resistance Rs (in ° C./W) of the sample was computed according to the equation: $Rs=(T1-T2)/30$.

4) Viscosity:
   Measured using an ARES viscoelastic measurement system (Rheometric Scientific).

5) Thermosoftening point:
   Measured using the Vicat softening temperature test method described in JIS K 7206.

6) Handleability by bend test:
   A sheet sized 5 cm×1 cm×0.5 mm (thick) was manually bent ten times and visually observed.

7) Heat resistance test:
   A sheet of 5 cm×1 cm×0.5 mm (thick) sandwiched between PET films was allowed to stand in a dryer at 150° C. for 30 days. Thereafter, it was cooled to room temperature and examined for handleability by bend test.

8) Number of cracks after thermal cycling test (between −30° C. and 100° C.):
   A sample, 2 cc, was interposed between a pair of transparent glass plates (thickness 1 mm, sides 50 mm×75 mm), the opposed sides of which were clamped by double clips. The sample assembly was placed in a thermal cycling tester between −30° C. and 100° C. The number of cracks in the sample after 500 cycles (30 minutes/cycle) was observed and rated according to the following criterion.
   Rating A: 0 to 5 cracks
   Rating B: more than 5 cracks 9) Flame retardant test:
   Measured according to the vertical burning test of UL-94.

Starting Materials

1) Silicone gum:
   KE-78VBS, methylvinylsilicone gum (composed mainly of D units) with a degree of polymerization 5,000-10,000 (trade name, Shin-Etsu Chemical Co., Ltd.)

2) Silicone resin 1:
   $D_{25}T^{Ph}_{65}D^{Vi}_{20}$ structure wherein D: $(CH_3)_2SiO_{2/2}$ units, $T^{Ph}$: $(C_6H_5)SiO_{3/2}$ units, and $D^{Vi}$: $(CH=CH_2)(CH_3)SiO_{2/2}$ units.

3) Silicone resin 2:
   $D_{21}T^{Ph}_{6.7}D^{Vi}_{0.35}$ structure wherein D, $T^{Ph}$ and $D^{Vi}$ are as defined above.

4) Silicone resin 3:
   KR-220L (consisting solely of T units)
5) Heat conductive filler 1:
   alumina AO-41R, average particle size 10 microns (trade name, Admatechs Co., Ltd.)
6) Heat conductive filler 2:
   alumina AO-502, average particle size 0.8 micron (trade name, Admatechs Co., Ltd.)
7) Treating agent for heat conductive filler:

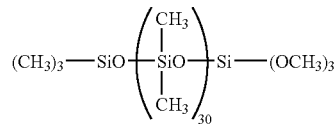

8) EPT base polymer:
   EPT-PX-055, ethylene-α-olefin-unconjugated polyene random copolymer (trade name, Mitsui Chemical Co., Ltd.)
9) Olefin pressure-sensitive adhesive:
   Lucant HC3000X, ethylene-α-olefin copolymer (trade name, Mitsui Chemical Co., Ltd.)
10) α-olefin: DIALEN 30 (trade name, Mitsubishi Chemical Corp.)
11) Linear alkyl-modified silicone

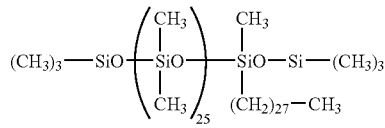

TABLE 2

| Ingredients (pbw) | Example 2 | Comparative Example 2 | Comparative Example 3 | Comparative Example 4 |
|---|---|---|---|---|
| Feature | Silicone base heat conductive sheet | polyolefin base heat conductive sheet | Silicone base heat conductive sheet | Silicone base heat conductive sheet |
| Silicone resin 1 | 100 | | | |
| Silicone resin 3 | | | 10 | 10 |
| Linear alkyl-modified silicone | | | 90 | 90 |
| Heat conductive filler 1 | 640 | 1152 | 200 | 640 |
| Heat conductive filler 2 | 160 | 288 | | 160 |
| Filler treating agent | 5.5 | 10 | | 5.5 |
| EPT base polymer | | 20 | | |
| Olefin adhesive | | 30 | | |
| α-olefin | | 70 | | |
| Flame retardant test UL-94 | extinguished with shape retained (equivalent V-0) | burned violently while melting and dripping | burned violently while melting and dripping | burned while melting |

According to the invention, there is obtained a heat dissipating member which has an enhanced heat dissipation ability, is improved in flame retardance, heat resistance, weather resistance or the like, and is easy to handle.

TABLE 1

| Ingredients (pbw) | Example 1 | Example 2 | Example 3 | Example 4 | Example 5 | Example 6 | Comparative Example 1 | Comparative Example 2 |
|---|---|---|---|---|---|---|---|---|
| Feature | silicone base heat conductive sheet | silicone base heat conductive sheet | silicone base heat conductive sheet | silicone base heat conductive sheet | silicone base heat conductive sheet | silicone base heat conductive sheet | silicone base heat conductive sheet | polyolefin base heat conductive sheet |
| Silicone gum | | | | 10 | | 50 | | |
| Silicone resin 1 | 100 | 100 | | 90 | | | 100 | |
| Silicone resin 2 | | | 100 | | | | | |
| Silicone resin 3 | | | | | 100 | 50 | | |
| Heat conductive filler 1 | 290 | 640 | 640 | 640 | 640 | 640 | 640 | 1152 |
| Heat conductive filler 2 | 72 | 160 | 160 | 160 | 160 | 160 | 160 | 288 |
| Filler treating agent | 2.5 | 5.5 | 5.5 | 5.5 | 5.5 | 5.5 | 5.5 | 10 |
| EPT base polymer | | | | | | | | 20 |
| Olefin adhesive | | | | | | | | 30 |
| α-olefin | | | | | | | | 70 |
| Specific gravity | 2.38 | 2.74 | 2.75 | 2.73 | 2.68 | 2.71 | 2.70 | 2.78 |
| Thermal conductivity, W/mK | 1.0 | 3.0 | 2.9 | 2.9 | 2.9 | 3.0 | 2.8 | 3.4 |
| Thermal resistance, °C./W | 0.06 | 0.12 | 0.16 | 0.14 | 0.06 | 0.45 | 1.2 | 0.09 |
| Viscosity @80° C., Pa·s | 3000 | 8400 | 14000 | 11000 | 6500 | 22000 | 41000 | 12000 |
| Thermosoftening point, °C. | 30-50 | 30-50 | 60-80 | 30-50 | 60-80 | 60-80 | N/A | 40-80 |
| Handleability by bend test of 0.5-mm gage sheet @25° C. | remained flexible, no cracks | remained flexible, no cracks | remained flexible, no cracks | remained flexible, no cracks | sheet was hard, with cracks observed | remained flexible, no cracks | remained flexible, no cracks | remained flexible, no cracks |
| Heat resistant test of 0.5-mm gage sheet @150° C./30 days | compound remained flexible | compound remained flexible | compound remained flexible | compound remained flexible | sheet was hard, with some cracks observed | compound remained flexible | compound remained flexible | Hardened in plastic state and turned brittle |
| Number of cracks after thermal cycling test (−30° C./100° C.) | B | B | B | A | B | A | A | B |

The invention claimed is:

1. A heat dissipating member which is disposed between a heat generating electronic component which when operated generates heat and reaches a temperature higher than room temperature and a heat dissipating component, wherein the heat dissipating member is solid in a room temperature state prior to operation of the electronic component and melts under heat generation during operation of the electronic component to fluidize at least a surface thereof so as to fill between the electronic component and the heat dissipating component without leaving any substantial voids, and the heat dissipating member is formed of a composition consisting of a silicone resin and a heat conductive filler, and wherein said silicone resin consists of $RSiO_{3/2}$ units (T units) and $R_2SiO_{2/2}$ units (D units) or $RSiO_{3/2}$ units, $R_2SiO_{2/2}$ units and $R_3SiO_{1/2}$ units (M units) for end-capping wherein R is a substituted or unsubstituted monovalent hydrocarbon radical having 1 to 10 carbon atoms.

2. The heat dissipating member of claim 1, wherein the heat conductive filler is a mixture of a filler having an average particle size of 0.1 to 5 μm and a filler having an average particle size of 5 to 25 μm.

3. The heat dissipating member of claim 1, wherein the heat conductive filler comprises at least one filler selected from the group consisting of copper, aluminum, alumina, silica, magnesia, red iron oxide, beryllia, titania, zirconia, aluminum nitride, silicon nitride, boron nitride, artificial diamond, and silicon carbide.

4. The heat dissipating member of claim 1, wherein the heat conductive filler has been surface treated.

5. The heat dissipating member of claim 4, wherein the heat conductive filler has been surface treated with an alkoxy group-containing diorganopolysiloxane or alkoxy group-containing silane.

6. The heat dissipating member of claim 1, having a thermal conductivity of at least 0.5 W/mK and a viscosity of $1 \times 10^2$ to $1 \times 10^5$ Pa·s at 80° C.

7. The heat dissipating member of claim 1, wherein the composition is formed into a sheet or film.

8. A heat dissipating member which is disposed between a heat generating electronic component which when operated generates heat and reaches a temperature higher than room temperature and a heat dissipating component, wherein the heat dissipating member is solid in a room temperature state prior to operation of the electronic component and melts under heat generation during operation of the electronic component to fluidize at least a surface thereof so as to fill between the electronic component and the heat dissipating component without leaving any substantial voids, and the heat dissipating member is formed of a composition consisting of a silicone resin, a silicone oil or gum having a viscosity of at least 100 Pa·s at 25° C., and a heat conductive filler, and wherein said silicone resin consists of $RSiO_{3/2}$ units (T units) or $RSiO_{3/2}$ units (T units) and $R_3SiO_{1/2}$ units (M units) for end-capping wherein R is a substituted or unsubstituted monovalent hydrocarbon radical having 1 to 10 carbon atoms, and the silicone oil or gum consists of $R_2SiO_{2/2}$ units or $R_2SiO_{2/2}$ units and $R_3SiO_{1/2}$ units for end-capping wherein R is defined above and is present in an amount of 1 to 100 parts by weigh per 100 parts by weight of the silicone resin.

9. The heat dissipating member of claim 8, wherein the heat conductive filler is a mixture of a filler having an average particle size of 0.1 to 5 μm and a filler having an average particle size of 5 to 25 μm.

10. The heat dissipating member of claim 8, wherein the heat conductive filler comprises at least one filler selected from the group consisting of copper, aluminum, alumina, silica, magnesia, red iron oxide, beryllia, titania, zirconia, aluminum nitride, silicon nitride, boron nitride, artificial diamond, and silicon carbide.

11. The heat dissipating member of claim 8, wherein the heat conductive filler has been surface treated.

12. The heat dissipating member of claim 11, wherein the heat conductive filler has been surface treated with an alkoxy group-containing diorganopolysiloxane or alkoxy group-containing silane.

13. The heat dissipating member of claim 8, having a thermal conductivity of at least 0.5 W/mK and a viscosity of $1 \times 10^2$ to $1 \times 10^5$ Pa·s at 80° C.

14. The heat dissipating member of claim 8, wherein the composition is formed into a sheet or film.

15. A heat dissipating member which is disposed between a heat generating electronic component which when operated generates heat and reaches a temperature higher than room temperature and a heat dissipating component, wherein the heat dissipating member is solid in a room temperature state prior to operation of the electronic component and melts under heat generation during operation of the electronic component to fluidize at least a surface thereof so as to fill between the electronic component and the heat dissipating component without leaving any substantial voids, and the heat dissipating member is formed of a composition consisting of a silicone resin, a heat conductive filler, and a surface treating agent for the heat conductive filler, and wherein said silicone resin consists of $RSiO_{3/2}$ units (T units) and $R_2SiO_{2/2}$ units (D units) or $RSiO_{3/2}$ units, $R_2SiO_{2/2}$ units and $R_3SiO_{1/2}$ units (M units) for end-capping wherein R is a substituted or unsubstituted monovalent hydrocarbon radical having 1 to 10 carbon atoms.

16. The heat dissipating member of claim 15, wherein the surface treating agent is an alkoxy group-containing diorganopolysiloxane or alkoxy group-containing silane.

17. A heat dissipating member which is disposed between a heat generating electronic component which when operated generates heat and reaches a temperature higher than room temperature and a heat dissipating component, wherein the heat dissipating member is solid in a room temperature state prior to operation of the electronic component and melts under heat generation during operation of the electronic component to fluidize at least a surface thereof so as to fill between the electronic component and the heat dissipating component without leaving any substantial voids, and the heat dissipating member is formed of a composition consisting of a silicone resin, a silicone oil or gum having a viscosity of at least 100 Pa·s at 25° C., a heat conductive filler, and a surface treating agent for the heat conductive filler, and wherein said silicone resin consists of $RSiO_{3/2}$ units (T units) or $RSiO_{3/2}$ units (T units)and $R_3SiO_{1/2}$ units (M units) for end-capping wherein R is a substituted or unsubstituted monovalent hydrocarbon radical having 1 to 10 carbon atoms, and the silicone oil or gum consists of $R_2SiO_{2/2}$ units or $R_2SiO_{2/2}$ units and $R_3SiO_{1/2}$ units for end-capping wherein R is defined above and is present in an amount of 1 to 100 parts by weigh per 100 parts by weight of the silicone resin.

18. The heat dissipating member of claim 17, wherein the surface treating agent is an alkoxy group-containing diorganopolysiloxane or alkoxy group-containing silane.

* * * * *